(12) United States Patent
Ryu et al.

(10) Patent No.: US 11,678,533 B2
(45) Date of Patent: Jun. 13, 2023

(54) DISPLAY DEVICE INCLUDING SIDE TERMINAL DISPOSED ALONG AN INCLINED SIDE SURFACE THEREOF

(71) Applicant: SAMSUNG DISPLAY CO., LTD., Yongin-si (KR)

(72) Inventors: Seung-Soo Ryu, Hwaseong-si (KR); Sanghyeon Song, Seoul (KR); Donghyun Lee, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 106 days.

(21) Appl. No.: 16/944,524

(22) Filed: Jul. 31, 2020

(65) Prior Publication Data

US 2021/0066437 A1    Mar. 4, 2021

(30) Foreign Application Priority Data

Sep. 3, 2019   (KR) .......................... 10-2019-0108530

(51) Int. Cl.
| | |
|---|---|
| *H10K 59/131* | (2023.01) |
| *H10K 71/00* | (2023.01) |
| *H10K 50/84* | (2023.01) |
| *H10K 59/12* | (2023.01) |
| *H01L 27/32* | (2006.01) |
| *H01L 51/56* | (2006.01) |
| *H01L 51/52* | (2006.01) |

(52) U.S. Cl.
CPC ........ *H01L 27/3276* (2013.01); *H01L 51/524* (2013.01); *H01L 51/56* (2013.01); *H01L 2227/323* (2013.01)

(58) Field of Classification Search
CPC .... H01L 27/3276; H01L 51/524; H01L 51/56
USPC .......................................................... 257/40
See application file for complete search history.

(56) References Cited

U.S. PATENT DOCUMENTS

| | | | |
|---|---|---|---|
| 9,720,268 B2 | 8/2017 | Liu et al. | |
| 2018/0190631 A1* | 7/2018 | Kim | ............... H01L 27/3276 |
| 2018/0226611 A1* | 8/2018 | Andou | ............... H01L 27/3265 |
| 2020/0013846 A1* | 1/2020 | Kwon | ............... H01L 27/3276 |
| 2020/0176537 A1* | 6/2020 | Son | ............... H01L 27/3267 |

FOREIGN PATENT DOCUMENTS

| | | | |
|---|---|---|---|
| KR | 10-2011-0110549 | 10/2011 | |
| KR | 20110110549 A | * 10/2011 | ............... H01J 11/48 |
| KR | 10-2015-0074275 | 7/2015 | |
| KR | 10-2017-0080937 | 7/2017 | |
| KR | 10-1910841 | 10/2018 | |

* cited by examiner

*Primary Examiner* — Matthew E. Gordon
(74) *Attorney, Agent, or Firm* — F. Chau & Associates, LLC

(57) ABSTRACT

A display device includes an array substrate including a pixel array disposed on a base substrate, a side terminal disposed on the base substrate, and a transfer wiring electrically connected to the side terminal and the pixel array, the array substrate having an inclined side surface, and a conductive connection pad including a first portion disposed on the inclined side surface of the array substrate to contact the side terminal and a second portion disposed on a lower surface of the array substrate. The first portion and the second portion are connected to each other.

11 Claims, 16 Drawing Sheets

DISPLAY DEVICE INCLUDING SIDE TERMINAL DISPOSED ALONG AN INCLINED SIDE SURFACE THEREOF

CROSS-REFERENCE TO RELATED APPLICATION

This application claims priority to and the benefit of Korean Patent Application No. 10-2019-0108530 filed on Sep. 3, 2019 in the Korean Intellectual Property Office, the entire disclosure of which is incorporated by reference herein in its entirety.

BACKGROUND

1. Field

The present inventive concept relates to a display device and a method of manufacturing the same, more particularly, a display device with a sloped side surface providing electrical connection and a method of manufacturing the same.

2. Description of the Related Art

A display device includes a display panel and a driver providing a driving signal to the display panel. The driver may be included in a driving chip. The driving chip may be combined directly with a substrate of the display panel, or may be connected to a pad part through a flexible printed circuit board or the like.

According to a conventional method, the driving chip or the flexible printed circuit board, on which the driving chip is mounted, is bonded to an upper surface of a substrate of the display panel. The area for bonding the driver to the display panel may increase a bezel size.

In order to reduce a bezel size, a flexible printed circuit board may be bonded to a side surface of the display panel. An end of the flexible printed circuit board may be bonded to the side surface of the display panel, and the flexible printed circuit board may extend to face a lower surface of the display panel. Thus, the flexible printed circuit board may have a bending portion, which may increase a thickness of the display device.

SUMMARY

Exemplary embodiments provide a display device having a reduced bezel and a reduced thickness.

Exemplary embodiments provide a method for manufacturing the display device.

According to an exemplary embodiment of the present inventive concept, a display device includes an array substrate including a pixel array disposed on a base substrate, a side terminal disposed on the base substrate, and a transfer wiring electrically connected to the side terminal and the pixel array, the array substrate having an inclined side surface, and a conductive connection pad including a first portion disposed on the inclined side surface of the array substrate to contact the side terminal and a second portion disposed on a lower surface of the array substrate. The first portion and the second portion are connected to each other.

In an exemplary embodiment, the display device further includes a cover substrate combined with the array substrate.

In an exemplary embodiment, the display device further includes a filling member disposed between the array substrate and the cover substrate and covering the side terminal.

In an exemplary embodiment, the conductive connection pad contacts a side surface of the filling member.

In an exemplary embodiment, the filling member protrudes from the side terminal beyond the inclined side surface in a lateral direction. The conductive connection pad contacts a lower surface of the filling member.

In an exemplary embodiment, the cover substrate has an inclined side surface, and the inclined side surface of the cover substrate and the inclined side surface of the array substrate has the same slope.

In an exemplary embodiment, the cover substrate has a vertical side surface.

In an exemplary embodiment, the inclined side surface has a round shape.

In an exemplary embodiment, the side terminal includes a plurality of conductive layers.

In an exemplary embodiment, the transfer wiring is spaced apart from the conductive connection pad.

In an exemplary embodiment, the display device further includes a driving device bonded to the conductive connection pad on the lower surface of the array substrate and configured to provide a driving signal or power to the transfer wiring through the conductive connection pad and the side terminal.

According to an exemplary embodiment of the present inventive concept, a method of manufacturing a display device includes preparing an array substrate including a pixel array disposed on a base substrate, a transfer wiring electrically connected to the pixel array and a conductive pattern electrically connected to the transfer wiring, removing a portion of the array substrate to form an inclined side surface and to form a side terminal from the conductive pattern, the side terminal being exposed at the inclined side surface, and forming a conductive connection pad including a first portion disposed on the side terminal and a second portion disposed on a lower surface of the array substrate.

According to exemplary embodiments, a side surface of a display panel is bonded to a driving device thereby reducing a size of a peripheral area or a bezel of the display panel.

Furthermore, since the external driving device may be bonded to the display panel without bending, a space may be removed or omitted for receiving a bending portion of the external driving device. Thus, a thickness of a display panel may be reduced, and a rigid circuit board may be used instead of a flexible printed circuit board, and damage due to bending stress may be prevented.

Furthermore, since the display panel has an inclined side surface, a conducive connection pad, which extends continuously on a lower surface and a side surface of the display panel, may be formed through a same deposition process.

BRIEF DESCRIPTION OF THE DRAWINGS

Aspects of one or more exemplary embodiments of the present inventive concept will be more clearly understood from the following detailed description taken in conjunction with the accompanying drawings.

DETAILED DESCRIPTION

A display device and a method for manufacturing a display device according to exemplary embodiments of the present inventive concept will be described hereinafter with reference to the accompanying drawings, in which some exemplary embodiments are shown.

Figure 1:
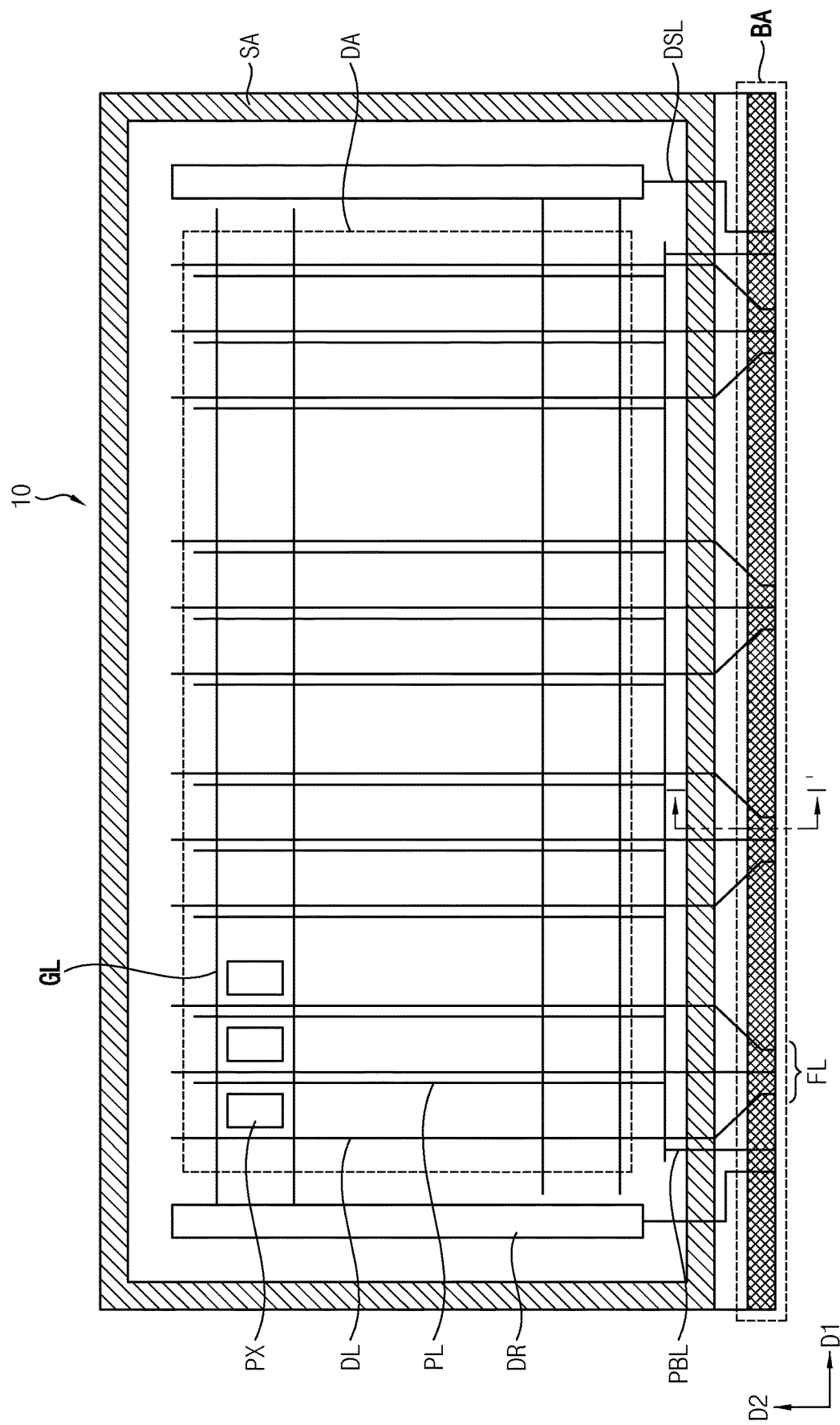
FIG. 1 is a plan view illustrating a display device according to an exemplary embodiment.

FIG. 1 is a plan view illustrating a display device according to an exemplary embodiment.

Referring to FIG. 1, a display panel 10 according to an exemplary embodiment includes a display area DA and a peripheral area surrounding or adjacent to the display area DA. The display area DA may include a plurality of pixels to display an image. The peripheral area may be defined as an area not displaying an image. The peripheral area may be referred to as a non-pixel area.

In an exemplary embodiment, the display panel 10 may be an organic light-emitting display panel. For example, an array of pixels PX including a light-emitting element may be disposed in the display area DA to generate a light in response to a driving signal. A signal wiring and a power wiring may be disposed in the display area DA to transfer a driving signal and a power to the pixels PX. For example, a gate line GL, a data line DL and a power line PL may be disposed in the display area DA. The gate line GL may extend along a first direction D1 and may provide a gate signal to the pixels PX. The data line DL may extend along a second direction D2 crossing the first direction D1 and may provide a data signal to the pixels PX. The power line PL may extend along the second direction D2 and may provide power to the pixels PX.

A transfer wiring, a circuit part or the like may be disposed in the peripheral area. The transfer wiring may transfer a driving signal or power to the display area DA. The circuit part may generate the driving signal. For example, a driver DR generating the gate signal, a control signal wiring DSL transferring a control signal to the driver DR, a fan-out wiring FL transferring a data signal to the data line DL, a power bus wiring PBL transferring power to the power line PL or the like may be disposed in the peripheral area.

In an exemplary embodiment, the peripheral area includes a sealing area SA in which a sealing member is disposed. The sealing area SA may have a shape surrounding the display area DA.

The transfer wiring may extend to a side end of the peripheral area. An end of the transfer wiring is electrically connected to a side terminal. The side terminal is electrically connected to an external driving device. Thus, the transfer wiring may be electrically connected to the external driving device to receive a driving signal, a control signal, a power or the like.

A bonding area BA may be defined by an area in which side terminals are disposed. For example, the side terminals may be arranged along the first direction D1 in the bonding area BA. A filling member FM covering the side terminals may be disposed in the bonding area BA. The electrical connection between the transfer wiring and the external driving device in the bonding area BA will be described with reference to FIG. 2, for example.

Figure 2:
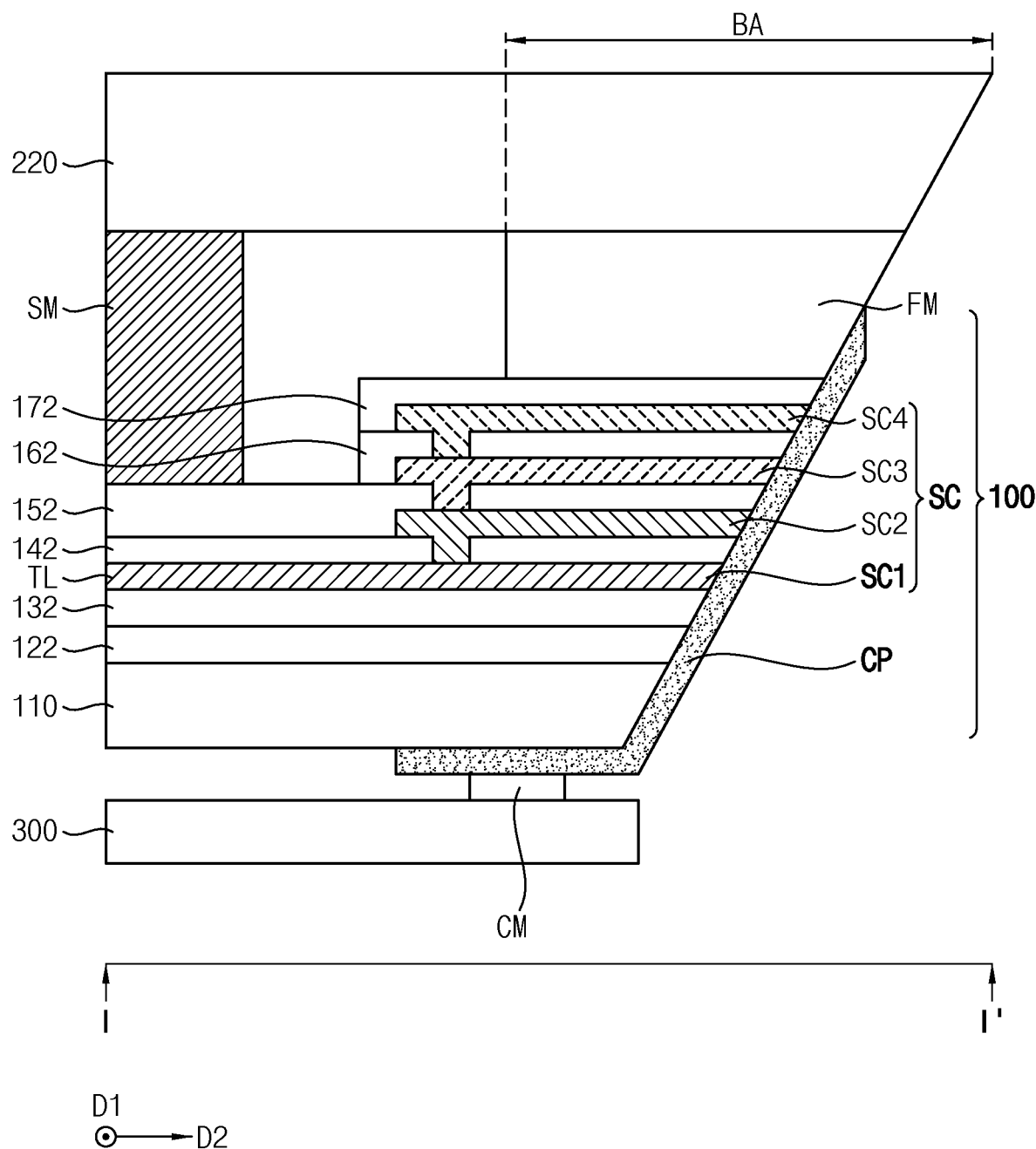
FIG. 2 is a cross-sectional view illustrating a bonding area of a display device according to an exemplary embodiment.
Figure 3:
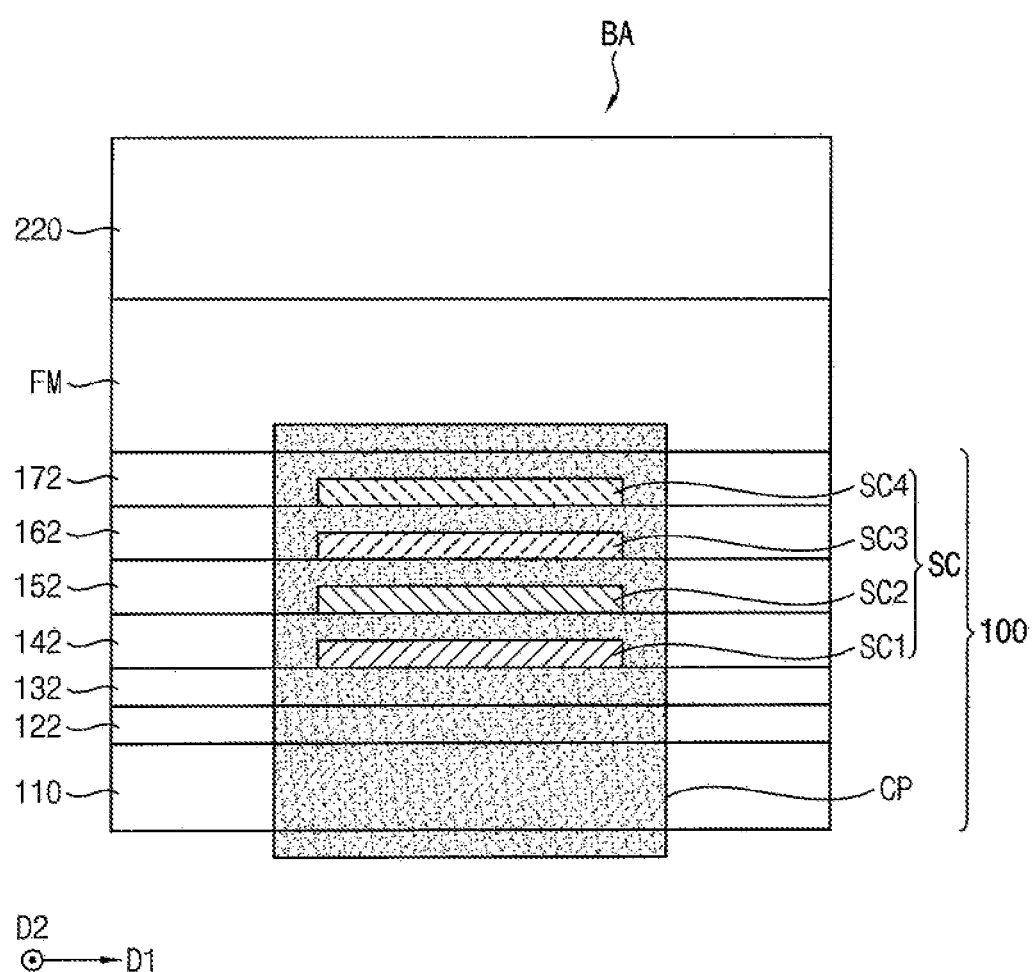
FIG. 3 is a lateral view illustrating a bonding area of a display device according to an exemplary embodiment.

FIG. 2 is a cross-sectional view illustrating a bonding area of a display device according to an exemplary embodiment. FIG. 3 is a lateral view illustrating a bonding area of a display device according to an exemplary embodiment. For example, FIG. 2 may illustrate a cross-sectional view taken along line I-I' of FIG. 1.

Referring to FIGS. 2 and 3, a display panel may include an array substrate 100, a cover substrate 220 combined with the array substrate 100, a sealing member SM disposed between the array substrate 100 and the cover substrate 220 and a filling member FM disposed between the array substrate 100 and the cover substrate 220. The filling member FM may extend along the first direction D1.

The display panel has an inclined side surface in the bonding area BA. For example, the array substrate 100 of the display panel has a first inclined side surface in the bonding area BA. The cover substrate 220 has a second inclined side surface in the bonding area BA. The filling member FM has a third inclined side surface in the bonding area BA. In an exemplary embodiment, the first inclined side surface, the second inclined side surface and the third inclined side surface may have the same slope. The present inventive concept is not limited thereto. In an exemplary embodiment, at least one of the array substrate 100 and the cover substrate 220 may have an inclined side surface in the bonding area BA.

A side surface of a side terminal SC contacts a conductive connection pad CP at the inclined side surface of the display panel. The conductive connection pad CP extends to be disposed on a lower surface of the array substrate 100. For example, the conductive connection pad CP includes a first portion that contacts the inclined side surface and a second portion that contacts the lower surface. The first portion and the second portion are connected to each other. A driving device is bonded to the first portion of the conductive connection pad CP, which is disposed on the lower surface of the array substrate 100. Thus, the driving device may be electrically connected to the transfer wiring. At least a portion of the side terminal may be covered by the filling member FM. In an exemplary embodiment, the second portion of the conductive connection pad CP partially covers the filling member FM. A contact interface between the side terminal SC and the conductive connection pad CP may be defined an exposed side surface of the side terminal SC. For example, the side terminal SC is exposed on the inclined side surface of the array substrate 100, and the exposed side terminal SC is connected to the second portion of the conductive connection pad CP that is disposed on the side surface of the array substrate 100.

For example, the driving device may include a circuit board 300, on which a driving chip is mounted. The driving chip may transfer a data signal to the transfer wiring through the circuit board 300. The circuit board 400 may include a flexible printed circuit board, a rigid printed circuit board or the like.

The circuit board 300 may be electrically connected to a printed circuit board, on which a controller is mounted. The printed circuit board including the controller may transfer a control signal, power or the like to the transfer wiring through the circuit board 300.

Figure 4:
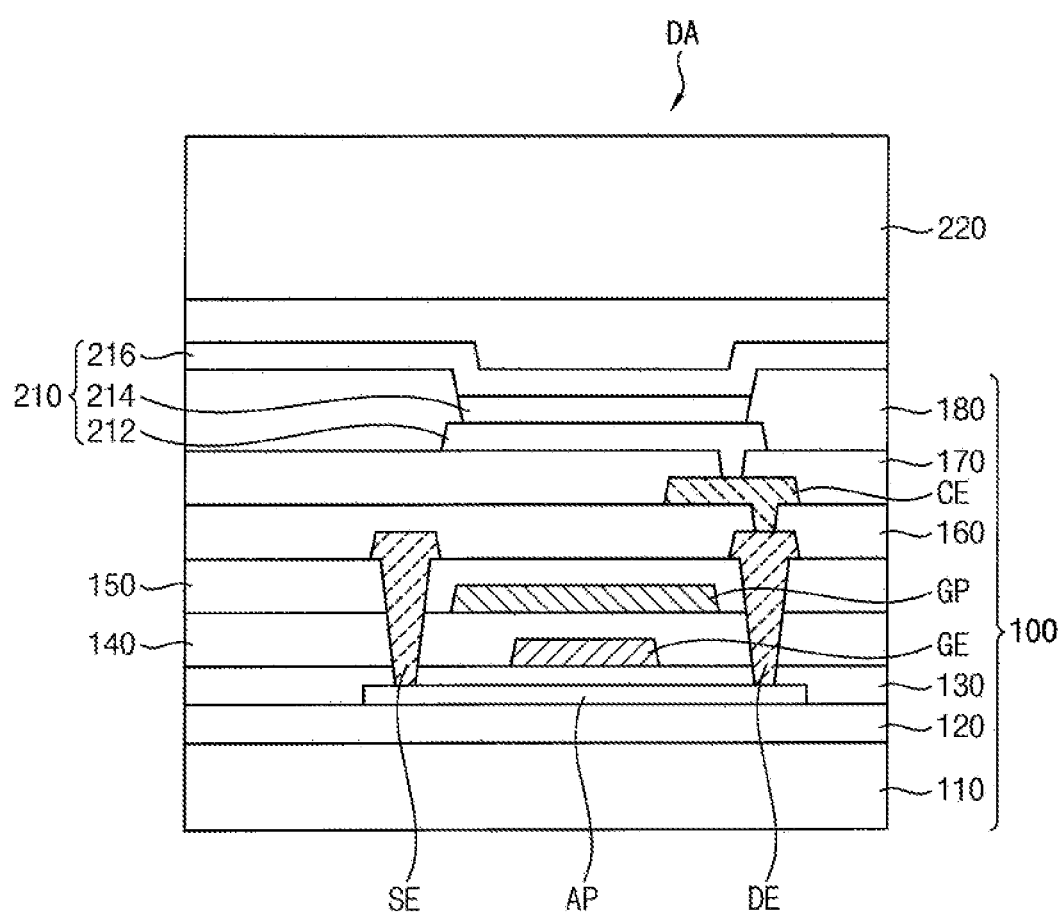
FIG. 4 is a cross-sectional view illustrating a display area of a display device according to an exemplary embodiment.

FIG. 4 is a cross-sectional view illustrating a display area of a display device according to an exemplary embodiment.

Referring to FIG. 4, a pixel unit disposed in the display area DA may include a driving element disposed on a base substrate 110 and a light-emitting element electrically connected to the driving element. In an exemplary embodiment, the light-emitting element may be an organic light-emitting diode. The driving element may include a pixel circuit including at least one thin film transistor.

A buffer layer 120 may be disposed on the base substrate 110. An active pattern AP may be disposed on the buffer layer 120.

For example, the base substrate 110 may include glass, quartz, sapphire, a polymeric material or the like. In an exemplary embodiment, the base substrate 110 may include a transparent rigid material such as glass.

The buffer layer 120 may prevent or reduce permeation of impurities, humidity or external gas from underneath of the base substrate 110, and may planarize an upper surface of the base substrate 110. For example, the buffer layer 120 may include an inorganic material such as oxide, nitride or the like.

A first gate metal pattern including a gate electrode GE may be disposed on the active pattern AP. A first insulation layer 130 may be disposed between the active pattern AP and the gate electrode GE.

A second gate metal pattern including a gate wiring pattern GP may be disposed on the gate electrode GE. The gate wiring pattern GP may include a capacitor electrode for forming a capacitor, a wiring for transferring various signals or the like.

A second insulation layer 140 may be disposed between the gate electrode GE and the gate wiring pattern GP. A third insulation layer 150 may be disposed on the gate wiring pattern GP.

For example, the active pattern AP may include silicon or a metal oxide semiconductor. In an exemplary embodiment, the active pattern AP may include polycrystalline silicon (polysilicon), which may be doped with n-type impurities or p-type impurities.

In an exemplary embodiment, an active pattern may include a metal oxide semiconductor. For example, the active pattern may include two-component compound (ABx), ternary compound (ABxCy) or four-component compound (ABxCyDz), which contains indium (In), zinc (Zn), gallium (Ga), tin (Sn), titanium (Ti), aluminum (Al), hafnium (Hf), zirconium (Zr), magnesium (Mg). For example, the active pattern may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO) or the like.

The first insulation layer 130, the second insulation layer 140 and the third insulation layer 150 may include silicon oxide, silicon nitride, silicon carbide or a combination thereof. Furthermore, the first insulation layer 130, the second insulation layer 140 and the third insulation layer 150 may include an insulating metal oxide such as aluminum oxide, tantalum oxide, hafnium oxide, zirconium oxide, titanium oxide or the like. For example, the first insulation layer 130, the second insulation layer 140 and the third insulation layer 150 may have a single-layered structure or a multi-layered structure including silicon nitride and/or silicon oxide, respectively, or may have different structures from each other.

The gate electrode GE and the gate wiring pattern GP may include metal, a metal alloy, metal nitride, a conductive metal oxide or the like. For example, the gate electrode GE and the gate wiring pattern GP may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers.

A first source metal pattern may be disposed on the third insulation layer 150. The first source metal pattern may include a source electrode SE and a drain electrode DE, which electrically contact the active pattern AP. The source electrode SE and the drain electrode DE may pass through the insulation layers disposed thereunder to contact the active pattern AP, respectively.

A fourth insulation layer 160 may be disposed on the first source metal pattern. A second source metal pattern may be disposed on the fourth insulation layer 160. The second source metal pattern may include a connection electrode CE to electrically connect the drain electrode DE to an organic light-emitting diode 210 disposed thereon. In an exemplary embodiment, the second source metal pattern may further include a mesh power line to prevent voltage drop of power applied to the organic light-emitting diode 210. A fifth insulation layer 170 may be disposed on the second source metal pattern.

The first and second source metal patterns may include metal, a metal alloy, metal nitride, a conductive metal oxide or the like. For example, the first and second source metal patterns may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers. In an exemplary embodiment, the first and second source metal patterns may have a multi-layered structure including an aluminum layer.

The fourth insulation layer 160 and the fifth insulation layer 170 may include an organic material. For example, the fourth insulation layer 160 and the fifth insulation layer 170 may include an organic insulation material such as a phenol resin, an acryl resin, a polyimide resin, a polyamide resin, a siloxane resin, an epoxy resin or the like.

An organic light-emitting diode 210 may be disposed on the fifth insulation layer 170. The organic light-emitting diode 210 may include a first electrode 212 contacting the connection electrode CE, an organic light-emitting layer 214 disposed on the first electrode 212 and a second electrode 216 disposed on the organic light-emitting layer 214. The organic light-emitting layer 214 of the organic light-emitting diode 210 may be disposed at least in an opening of a pixel-defining layer 180 disposed on the fifth insulation layer 170. The first electrode 212 may be a lower electrode of the organic light-emitting diode 210, and the second electrode 216 may be an upper electrode of the organic light-emitting diode 210.

The first electrode 212 may function as an anode. For example, the first electrode 212 may be formed as a transparent electrode or a reflective electrode according to an emission type of the display device. When the first electrode 212 is a transparent electrode, the first electrode 212 may include indium tin oxide, indium zinc oxide, zinc tin oxide, indium oxide, zinc oxide, tin oxide or the like. When the first electrode 212 is a reflective electrode, the first electrode 212 may include gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stacked structure further including a material that may be used for a transparent electrode.

The pixel-defining layer 180 has the opening overlapping at least a portion of the first electrode 212. For example, the pixel-defining layer 180 may include an organic insulating material.

The organic light-emitting layer 214 may include at least a light-emitting layer, and may further include at least one of a hole injection layer (HIL), a hole transporting layer (HTL), an electron transporting layer (ETL) and an electron injection layer (EIL). For example, the organic light-emitting layer 214 may include a low molecular weight organic compound or a high molecular weight organic compound.

In an exemplary embodiment, the organic light-emitting layer 214 may emit a red light, a green light or a blue light. In an exemplary embodiment, the organic light-emitting layer 214 may emit a white light. The organic light-emitting layer 214 emitting a white light may have a multi-layer structure including a red-emitting layer, a green-emitting layer and a blue-emitting layer, or a single-layer structure including a mixture of a red-emitting material, a green-emitting material and a blue-emitting material.

The second electrode 216 may be formed as a transparent electrode or a reflective electrode according to an emission type of the display device. For example, the second electrode 216 may include metal, a metal alloy, metal nitride, metal fluoride, a conductive metal oxide or a combination thereof.

For example, the second electrode 216 may be formed as a common layer extending continuously over a plurality of pixels in the display area DA.

A cover substrate 220 is disposed on the organic light-emitting diode 210. For example, the cover substrate 220 may include glass, quartz, sapphire, a polymeric material or the like. In an exemplary embodiment, the cover substrate 220 may include a transparent rigid material such as glass.

For example, a spacer may be disposed under the cover substrate 220 to support the cover substrate 220. The spacer may be disposed between the cover substrate 220 and the organic light-emitting diode 210 or between the pixel-defining layer 180 and the second electrode 216 of the organic light-emitting diode 210.

A space between the cover substrate 220 and the organic light-emitting diode 210 may have a vacuum state or may be filled with a gas or a sealing member. The sealing member may include an organic layer, an inorganic layer or a combination thereof.

Referring to FIGS. 2 and 3, a transfer wiring TL may extend toward the inclined side surface of the display panel in the bonding area BA. For example, the transfer wiring TL may extend toward the inclined side surface of the array substrate 100 in the bonding area BA. In an exemplary embodiment, the transfer wiring TL may be the fan-out wiring FL illustrated in FIG. 1. However, exemplary embodiments are not limited thereto. For example, the transfer wiring TL may be the power bus wiring PBL, the control signal wiring DSL or a bridge wiring connected thereto.

For example, the buffer layer 122 and the first insulation layer 132 may be disposed between the transfer wiring TL and the base substrate 110 in the bonding area BA. The buffer layer 122 and the first insulation layer 132 may extend from the buffer layer 120 and the first insulation layer 130, which are disposed in the display area DA, or may be formed from same layers as the buffer layer 120 and the first insulation layer 130.

In an exemplary embodiment, the transfer wiring TL and the gate electrode GE may be formed from the same layer.

The side terminal SC electrically contacts the transfer wiring TL, and extends to the side surface of the display panel to be exposed to an exterior through the sides surface of the display panel. For example, the side terminal SC extends to the side surface of the array substrate 100 of the display panel. In an exemplary embodiment, the side terminal SC may have a multi-layered structure including a plurality of conductive layers.

For example, the side terminal SC may include a first conductive layer SC1 extending from the transfer wiring TL, a second conductive layer SC2 disposed on the first conductive layer SC1, a third conductive layer SC3 disposed on the second conductive layer SC2 and a fourth conductive layer SC4 disposed on the third conductive layer SC3. However, exemplary embodiments are not limited thereto, and the side terminal SC may have various structures. For example, the side terminal SC may include at least one conductive layer. In an exemplary embodiment, the side terminal SC may include at least two conductive layers to increase a contact area.

In an exemplary embodiment, the transfer wiring TL and the first conductive layer SC1 extending from the transfer wiring TL may be formed from the same layer as the gate electrode GE disposed in the display area DA. The second conductive layer SC2 may be formed from the same layer as the gate wiring pattern GP disposed in the display area DA. The third conductive layer SC3 may be formed from the same layer as the first source metal pattern disposed in the display area DA. The fourth conductive layer SC4 may be formed from the same layer as the second source metal pattern disposed in the display area DA.

For example, a second insulation layer 142 may be disposed between the first conductive layer SC1 and the second conductive layer SC2. A third insulation layer 152 may be disposed between the second conductive layer SC2 and the third conductive layer SC3. A fourth insulation layer 162 may be disposed between the third conductive layer SC3 and the fourth conductive layer SC4. A fifth insulation layer 172 may be disposed on the fourth conductive layer SC4.

For example, a portion of the second conductive layer SC2 may pass through the second insulation layer 142 to electrically contact the first conductive layer SC1. A portion of the third conductive layer SC3 may pass through the third insulation layer 152 to electrically contact the second conductive layer SC2. A portion of the fourth conductive layer SC4 may pass through the fourth insulation layer 162 to electrically contact the third conductive layer SC3.

The second insulation layer 142, the third insulation layer 152, the fourth insulation layer 162 and the fifth insulation layer 172 may extend from the second insulation layer 140, the third insulation layer 150, the fourth insulation layer 160 and the fifth insulation layer 170, which are disposed in the display area DA, or may be formed from same layers as the second insulation layer 140, the third insulation layer 150, the fourth insulation layer 160 and the fifth insulation layer 170, respectively.

At least one of the first insulation layer 132, the second insulation layer 142, the third insulation layer 152, the fourth insulation layer 162 and the fifth insulation layer 172 may be removed or omitted in an area overlapping the sealing member SM or in the bonding area BA. For example, an insulation layer including an organic material may be removed under the sealing member SM.

In an exemplary embodiment, a filling member FM is disposed between the array substrate 100 and the cover substrate 220. The filling member FM may fill at least a portion of a space between the side terminal SC and the cover substrate 220 in the bonding area BA to prevent impurities from entering the display panel or to prevent damage to the sealing member SM, in the process of forming the conductive connection pad CP or grinding the side surface of the display panel to form the inclined side surface.

In an exemplary embodiment, the filling member FM may include an organic material such as a urethane resin, a silicon resin, an acrylic resin, an epoxy resin, a phenolic resin or the like.

Referring to FIG. 2, the filling member FM may be spaced apart from the sealing member SM. However, exemplary embodiments are not limited thereto. For example, the filling member FM may substantially contact or be connected to the sealing member SM.

The conductive connection pad CP is disposed on the side surface of the display panel to contact the side terminal SC. The conductive connection pad CP may extend in an inclined direction along the inclined side surface of the display panel. The conductive connection pad CP may further extend along a lower surface of the display panel so that a portion of the conductive connection pad CP may be disposed on the lower surface of the display panel.

The conductive connection pad CP may include metal. For example, a metal layer may be formed by depositing metal such as gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or the like. The metal layer may be patterned, for example, by laser to form the conductive connection pad CP.

The conductive connection pad CP may be bonded to the circuit board 300 by a conductive connection member CM.

The conductive connection member CM may be formed by various methods. For example, the conductive connection member CM may be an anisotropic conductive film ACF having conductive particles dispersed therein. In an exemplary embodiment, the conductive connection member CM may be a conductive bump bonded to the conductive connection pad CP, for example, by supersonic welding or the like. However, exemplary embodiments are not limited thereto, and various conventional boding methods may be used for bonding the conductive connection pad CP to the circuit board 300 and for forming the conductive connection member CM.

Even though not illustrated, a coating layer covering an exposed portion of the conductive connection pad CP may be formed at the side surface of the display panel by using a curable resin or the like.

According to exemplary embodiments, a side surface of a display panel is bonded to an external driving device thereby reducing a size of a peripheral area or a bezel of the display panel.

Furthermore, since the external driving device may be bonded to the display panel without bending, a space may be removed or omitted for receiving a bending portion of the external driving device. Thus, a thickness of a display panel may be reduced, and a rigid circuit board may be used instead of a flexible printed circuit board, and damage due to bending stress may be prevented.

Furthermore, since the display panel has an inclined side surface, a conducive connection pad, which extends continuously on a lower surface and a side surface of the display panel, may be formed through a same deposition process.

FIGS. 5 to 8 are cross-sectional views illustrating a method of manufacturing a display device according to an exemplary embodiment. FIGS. 5 to 8 may illustrate a bonding area of the display device.

Figure 5:
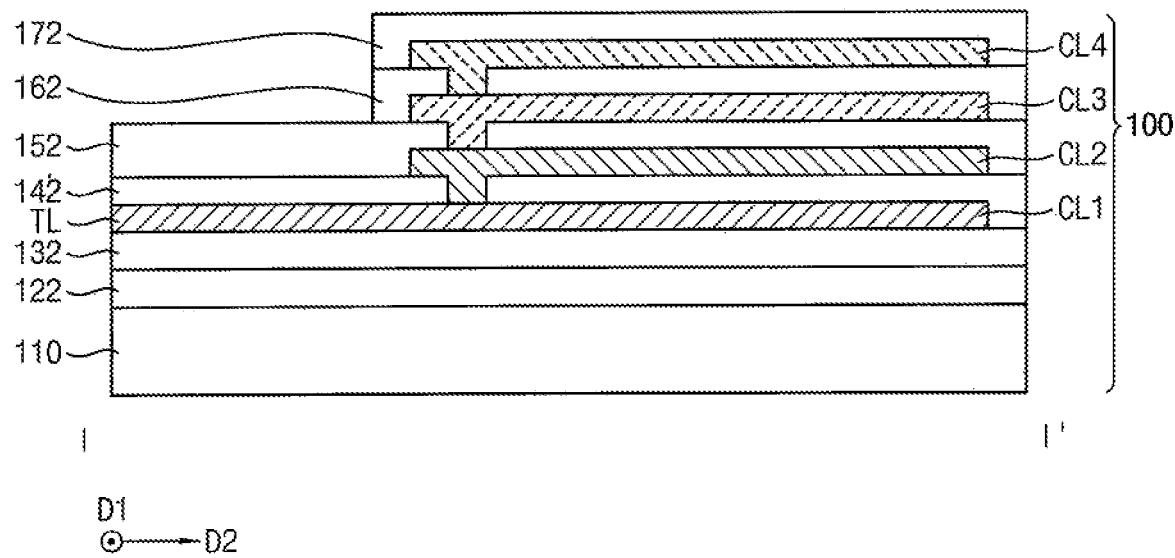
FIGS. 5 to 15 are cross-sectional views illustrating a method for manufacturing a display device according to exemplary embodiments.

Referring to FIG. 5, a buffer layer 122 is formed on a base substrate 110. A first insulation layer 132 is formed on the buffer layer 122. A transfer wiring TL is formed on the first insulation layer 132. A second insulation layer 142 is formed on the transfer wiring TL. An end portion of the transfer wiring TL may serve as a first conductive pattern CL1. A second conductive pattern CL2 is formed on the second insulation layer 142. The second conductive pattern CL2 contacts the first conductive pattern CL1. A third insulation layer 152 is formed on the second conductive pattern CL2. A third conductive pattern CL3 is formed on the third insulation layer 152. The third conductive pattern CL3 contacts the second conductive pattern CL2. A fourth insulation layer 162 is formed on the third conductive pattern CL3. A fourth conductive pattern CL4 is formed on the fourth insulation layer 162. The fourth conductive pattern CL4 contacts the third conductive pattern CL3. A fifth insulation layer 172 is formed on the fourth conductive pattern CL4.

The above insulation layers and conductive patterns may be formed in the process of forming a thin film transistor disposed in a display area.

The base substrate 110, a pixel array formed on the base substrate 110 and a structure formed on the base substrate 110 in a bonding area BA may be integrally referred as an array substrate 100.

Figure 6:
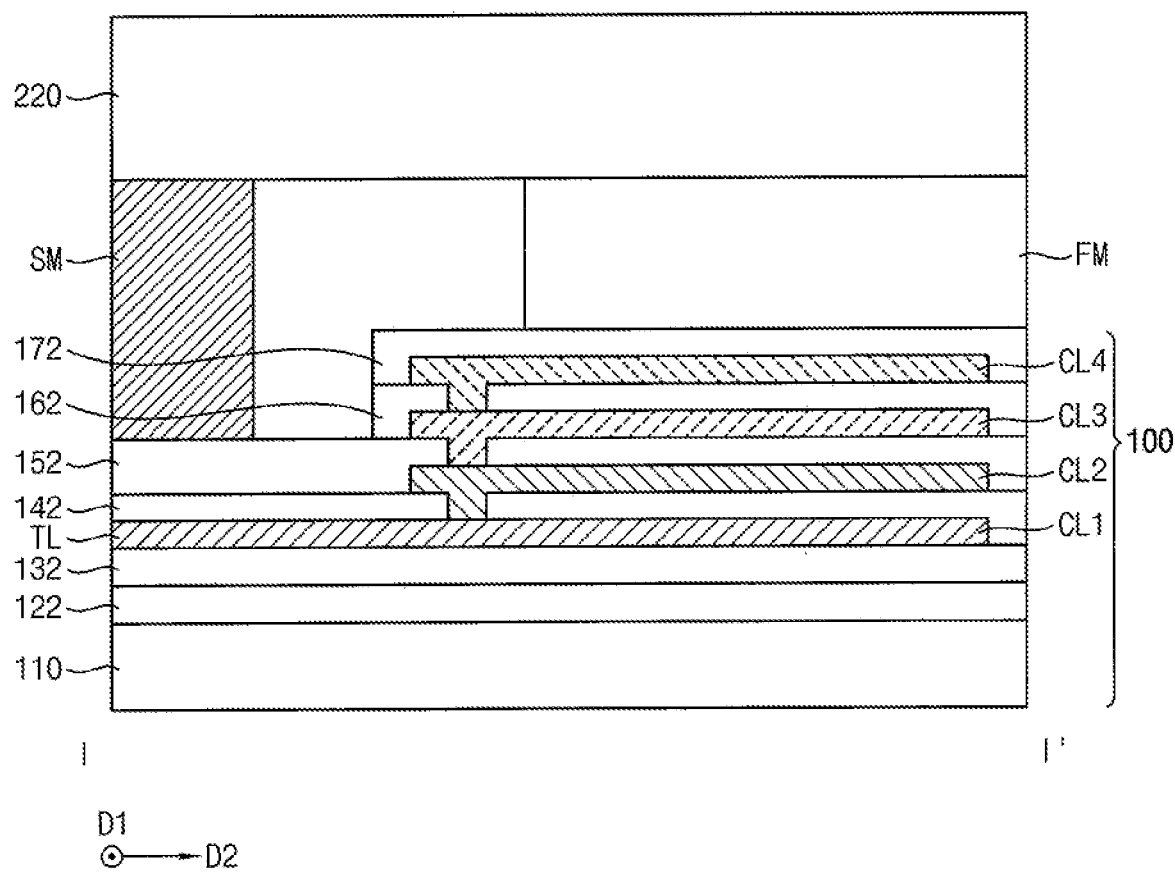

Referring to FIG. 6, a cover substrate 220 is provided on the array substrate 100. A sealing member SM may be formed between the cover substrate 220 and the array substrate 100 to combine the cover substrate 220 with the array substrate 100 and to encapsulate light-emitting elements in the display area.

For example, the sealing member SM may be formed from a curable resin or a glass frit. In an exemplary embodiment, a glass frit may be coated on a sealing area, the cover substrate 220 may be disposed on the glass frit, and the glass frit may be sintered by heat, UV ray, laser or the like to form the sealing member SM.

Furthermore, a filling member FM may be provided between the cover substrate 220 and a stack of the first to the fourth conductive patterns CL1 to CL4.

In an exemplary embodiment, a curable resin may be coated on a bonding area to form the filling member FM before the cover substrate 220 is combined with the array substrate 100. The coated curable resin may be cured before or after the cover substrate 220 is combined with the array substrate 100. For example, the curable resin may include a photo-curable composition. The photo-curable composition may include a binder element such as an epoxy resin, a urethane resin, a silicon resin, an acrylic resin, a phenolic resin or the like.

In an exemplary embodiment, the filling member FM may be formed from a glass frit. For example, the filling member FM may include a same material as the sealing member SM. When the filling member FM is formed from a glass frit, an organic insulation layer may be removed in an area where the filling member FM is formed.

In an exemplary embodiment, the filling member FM may be formed by providing and curing a curable resin between the array substrate 100 and the cover substrate 220 after the cover substrate 220 is combined with the array substrate 100.

In an exemplary embodiment, the filling member FM may be formed after a process of scribing the display panel. After the filling member FM is formed, a grinding process such as a polishing process may be performed for planarizing the side surface of the display panel.

Figure 7:
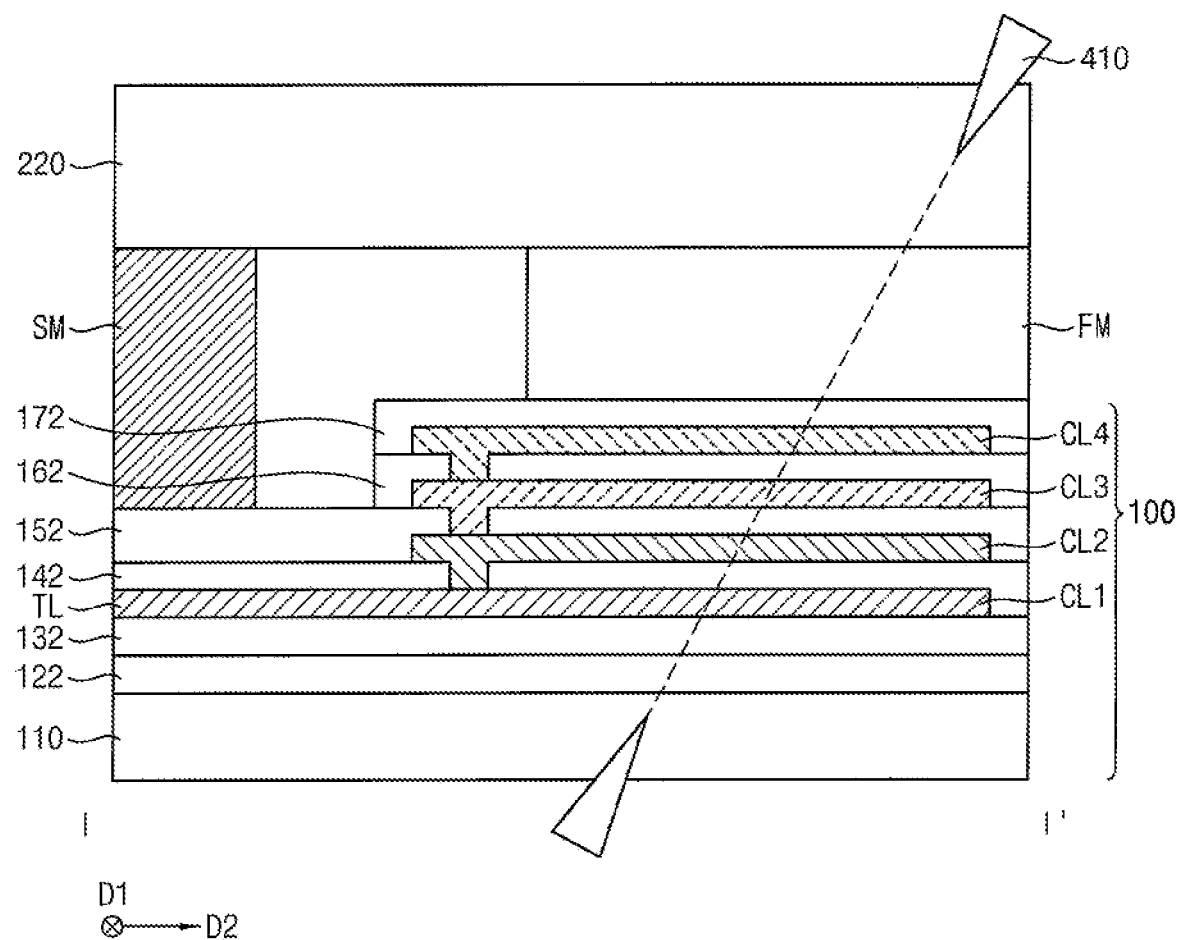

Referring to FIG. 7, the display panel is scribed or cut to form an inclined side surface.

The display panel may be scribed by a scribing member 410 such as a scribing wheel or the like. In an exemplary embodiment, the scribing member 410 may scribe the display panel in an inclined direction with respect to a vertical direction for an upper surface or a lower surface of the display panel to form the inclined side surface.

Figure 8:
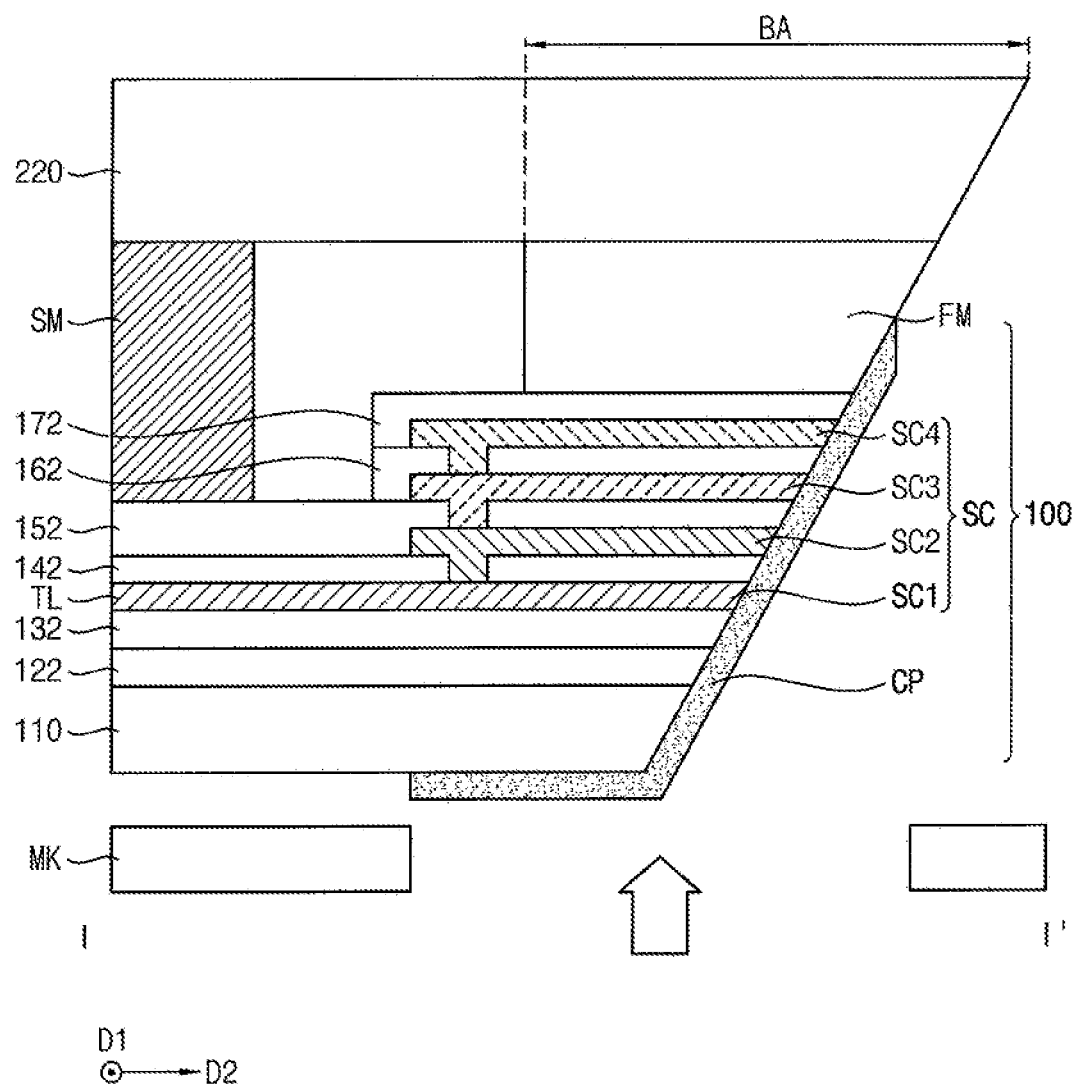

Referring to FIG. 8, after the first to fourth conductive patterns CL1, CL2, CL3 and CL3 are partially removed, remaining conductive layers SC1, SC2, SC3 and SC4 may form a side terminal SC. A side surface of each of the conductive layers SC1, SC2, SC3 and SC4 may be exposed through a side surface of the display panel (or the array substrate 100).

As the display panel is scribed along an inclined direction with respect to a vertical direction, the cover substrate 220 and the array substrate 100 may have an inclined side surface. For example, a length, in the second direction D2, of an upper surface of the cover substrate 220 may be larger than a length, in the second direction D2, of a lower surface of the cover substrate 220, and a length, in the second direction D2, of an upper surface of the array substrate 100 may be larger than a length, in the second direction D2, of a lower surface of the array substrate 100. Furthermore, the length of the lower surface of the cover substrate 220 may be larger than the length of the upper surface of the array substrate 100. Thus, the lower surface and the side surface of the array substrate 100 may form an obtuse angle, and the upper surface and the side surface of the cover substrate 220 may form an acute angle.

Furthermore, the side terminal SC and the filling member FM may have an inclined side surface. However, exemplary embodiments are not limited thereto. For example, at least one of the side terminal SC and the filling member FM may have a side surface extending vertically.

Thereafter, a conductive connection pad CP is formed. The conductive connection pad CP may include a first portion that contacts the side terminal SC, and a second portion that contacts the lower surface of the display panel. The first portion and the second portion may be connected to each other. In an exemplary embodiment, the conductive connection pad CP may extend along the side surface and the lower surface of the display panel. In an exemplary embodiment, the side surface of the display panel and the lower surface of the display panel may include a side surface of the array substrate 100 and a lower surface of the array substrate 100, respectively.

For example, a mask MK is disposed under the display panel. The mask MK may have an opening overlapping at least a portion of the lower surface and the inclined side surface of the display panel. A metal layer is formed on an exposed portion of the lower surface and the inclined side surface of the display panel by a physical deposition process such as sputtering, evaporation or the like using the mask MK as a deposition mask. As a result, the metal layer may extend along the lower surface and the inclined side surface of the display panel and may contact the side terminal SC.

Thereafter, the metal layer is patterned by laser or the like to form an array of conductive connection pads CP spaced apart from each other and contacting corresponding side terminals SC.

For example, a portion of the conductive connection pad CP may contact a side surface of the filling member FM.

Furthermore, the conductive connection pad CP may extend to contact the side surface of the cover substrate 220.

Thereafter, an external driving device is bonded to the conductive connection pad CP disposed on the lower surface of the display panel to fabricate the display device illustrated in FIG. 2.

In an exemplary embodiment, an external driving device may be bonded to a side surface of the display panel. The side surface of the display panel after performing a scribing process may rough or irregular, and thus a process of grinding or polishing the side surface of the display panel may be performed to reduce roughness of the side surface to provide a bonding surface for the external driving device.

According to exemplary embodiments, an external driving device may be bonded to a lower surface of the display panel, which has a relatively small roughness. Thus, the process of grinding or polishing the side surface of the display panel may be omitted.

Furthermore, since the display panel has the inclined side surface, a continuous metal layer on the inclined side surface and the lower surface of the display panel may be formed through a same physical deposition process.

Exemplary embodiments may have various configurations. Hereafter, exemplary embodiments will be explained with reference to drawings.

Figure 9:
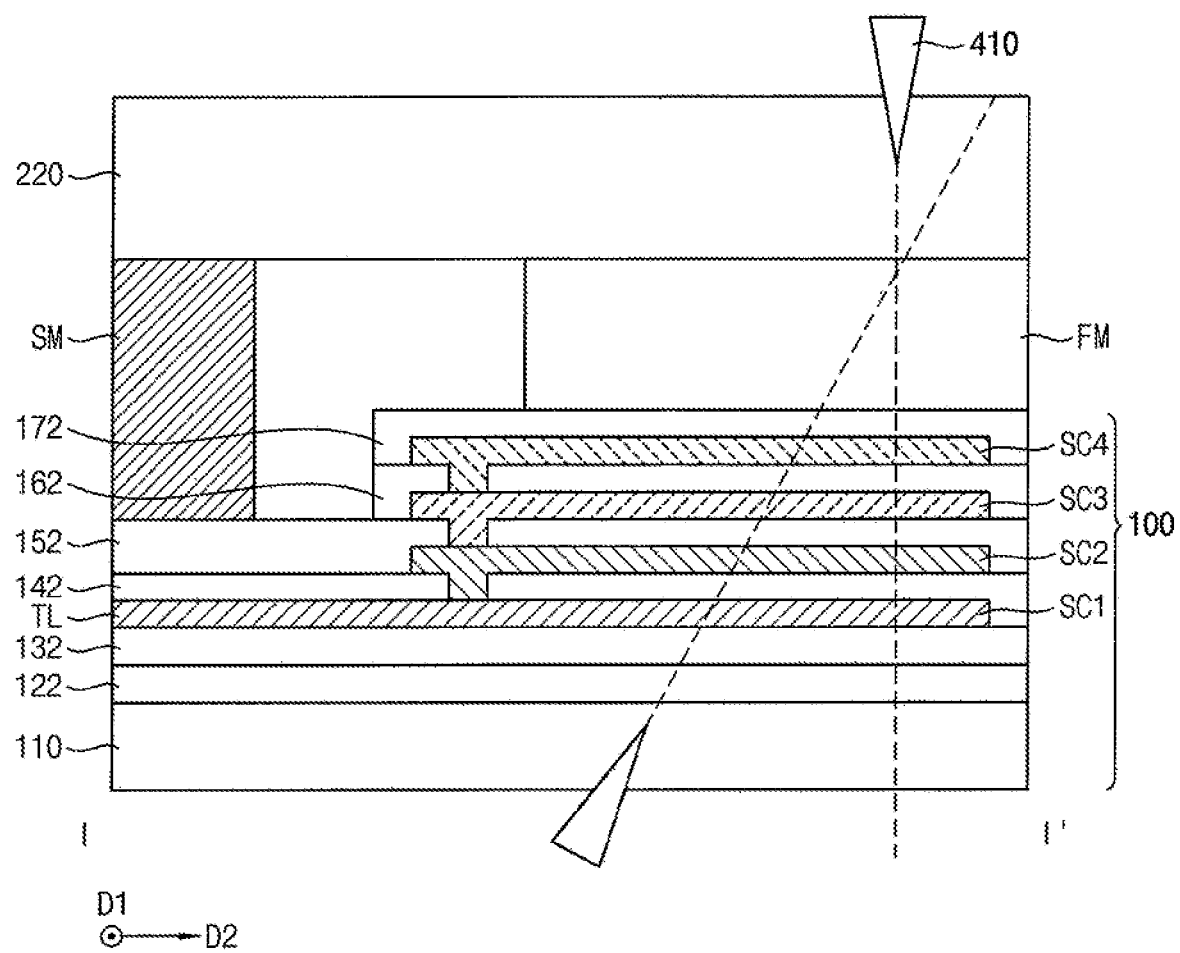
Figure 10:
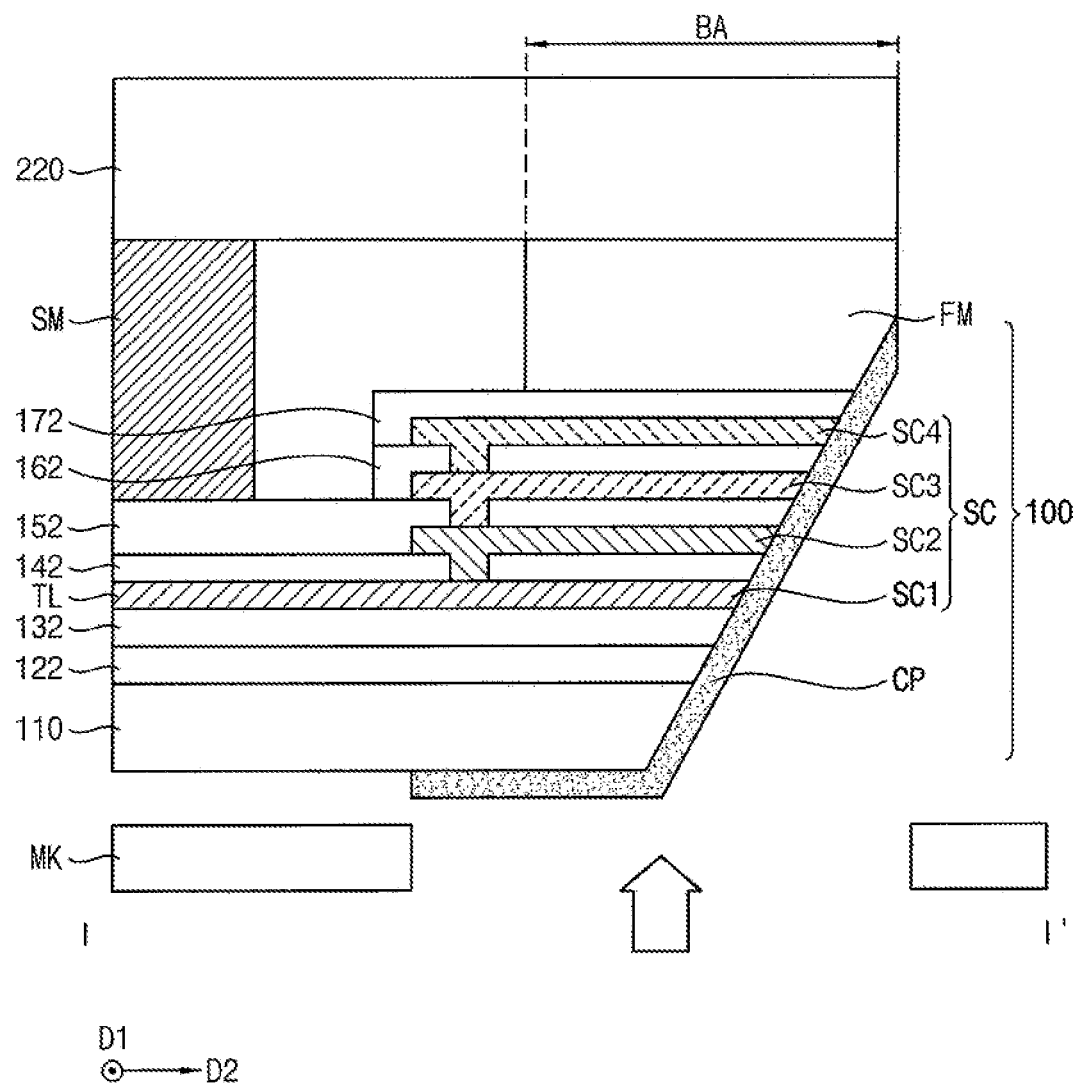
Figure 11:
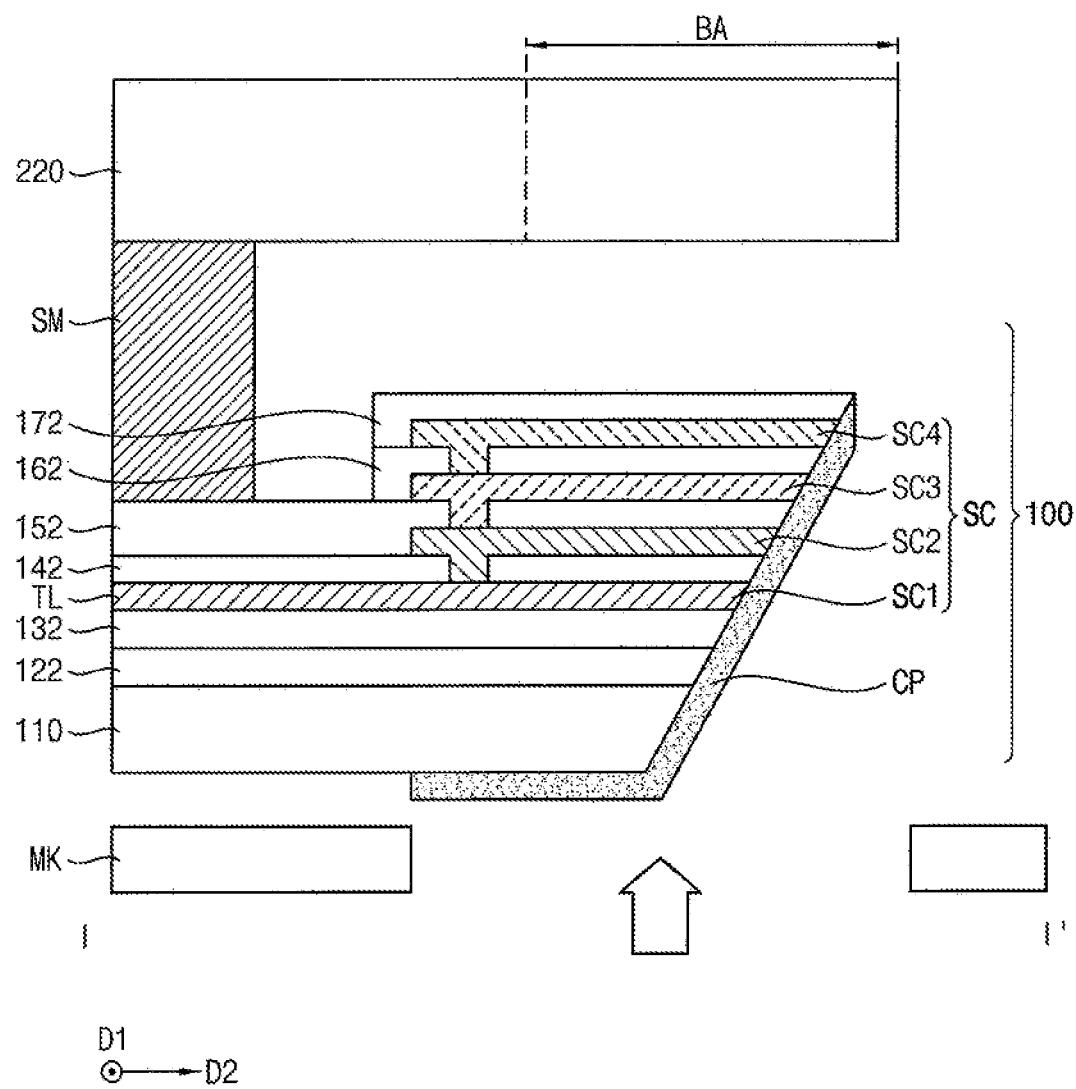

FIGS. 9 to 11 are cross-sectional views illustrating a method of manufacturing a display device according to exemplary embodiments.

Referring to FIG. 9, an array substrate 100 and a cover substrate 220 may be scribed in different directions. In an exemplary embodiment, the array substrate 100 may be scribed in an inclined direction with respect to a vertical direction for a lower surface of the array substrate 100, and the cover substrate 220 may be scribed in a vertical direction for an upper surface of the cover substrate 220.

Referring to FIG. 10, the scribed cover substrate 220 may have a side surface extending in a vertical direction. Thus, a size of a bonding area BA may be reduced thereby reducing a bezel of a display device. A filling member FM disposed between the cover substrate 220 and the array substrate 100 may have a side surface connected to the side surface of the cover substrate 220 and extending in a vertical direction.

Thereafter, a conductive connection pad CP is formed. The conductive connection pad CP may contact a side terminal SC, and may extend along a side surface and a lower surface of a display panel. In an exemplary embodiment, an end of the conductive connection pad CP and the side surface of the cover substrate 220 may be disposed in a substantially same vertical line. Thus, a length, in the second direction D2, of an upper surface of the cover substrate 220 may be substantially the same as a length, in the second direction D2, of a lower surface of the cover substrate 220, and a length, in the second direction D2, of an upper surface of the array substrate 100 may be larger than a length, in the second direction D2, of a lower surface of the array substrate 100. Furthermore, as illustrated in FIG. 11, a filling member may be omitted in a display panel according to an exemplary embodiment.

Figure 12:
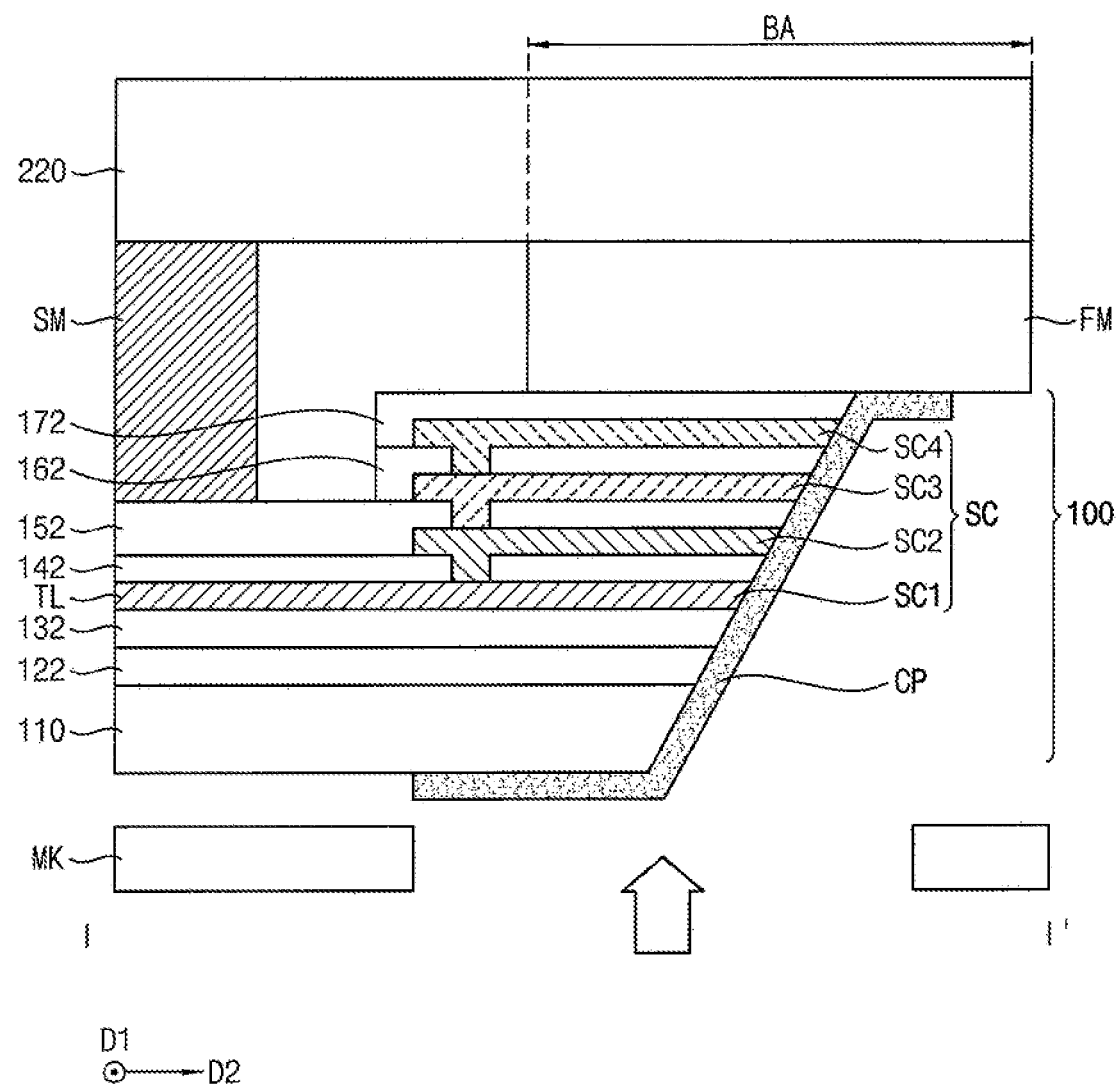

FIG. 12 is a cross-sectional view illustrating a method of manufacturing a display device according to an exemplary embodiment.

Referring to FIG. 12, an array substrate 100 may be scribed in an inclined direction with respect to a vertical direction for a lower surface of the array substrate 100, and a cover substrate 220 may be scribed in a vertical direction for an upper surface of the cover substrate 220.

The scribed cover substrate 220 may have a side surface extending in the vertical direction. A filling member FM disposed between the cover substrate 220 and the array substrate 100 may have a side surface connected to the side surface of the cover substrate 220 and extending in the vertical direction.

The cover substrate 220 or the filling member FM may protrude from a side surface of the array substrate 100 in a lateral direction beyond the side surface of the array substrate 100.

A conductive connection pad CP may contact a side terminal SC, and may extend along a side surface and a lower surface of a display panel. A portion of the conductive connection pad CP may extend in a lateral direction along a lower surface of the filling member FM. For example, the conductive connection pad CP may include a first portion that contacts the side surface of the array substrate 100, a second portion that contacts the lower surface of the array substrate 100, and a third portion that contacts the lower surface of the filling member FM. The above configuration may increase a contact area of the conductive connection pad CP thereby increasing a connection reliability of the display device.

Figure 13:
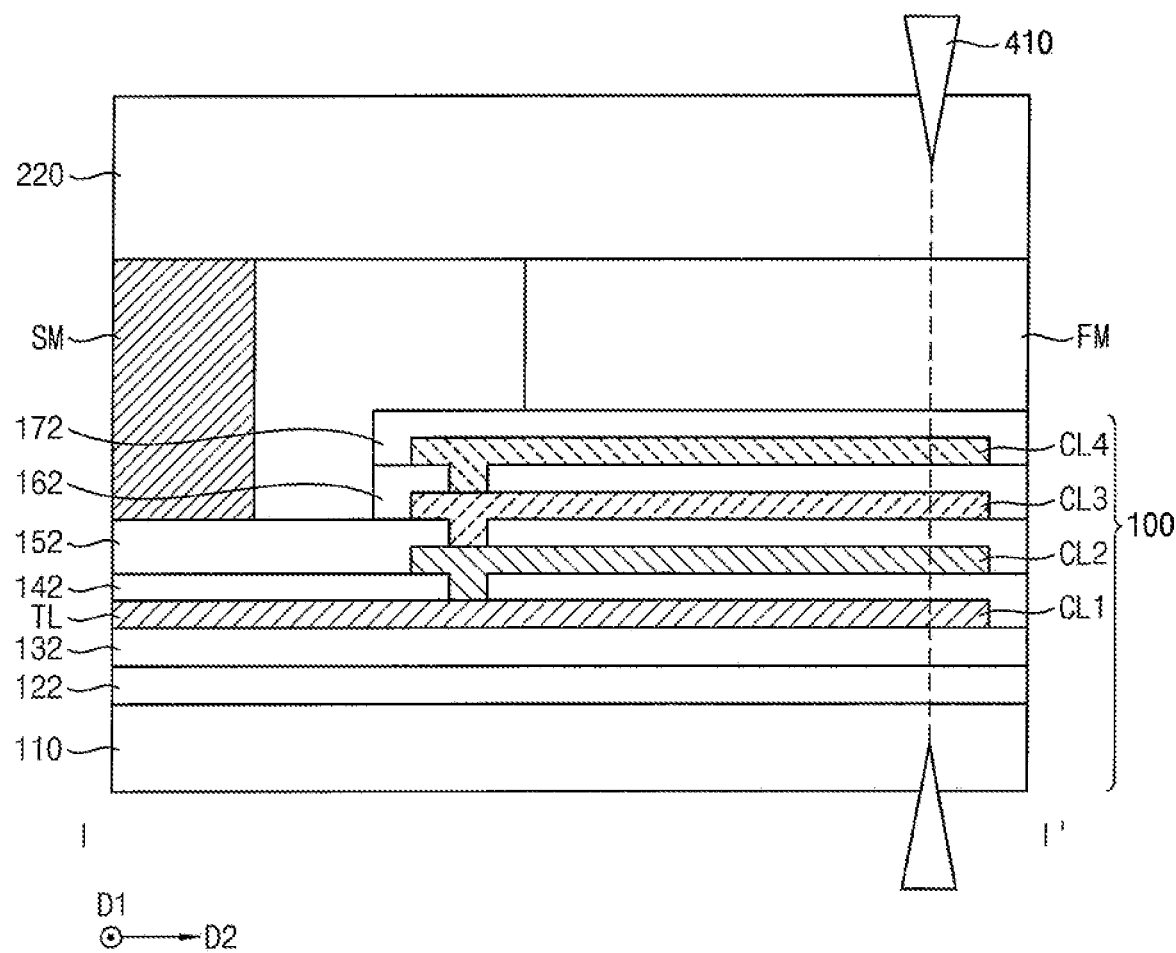
Figure 14:
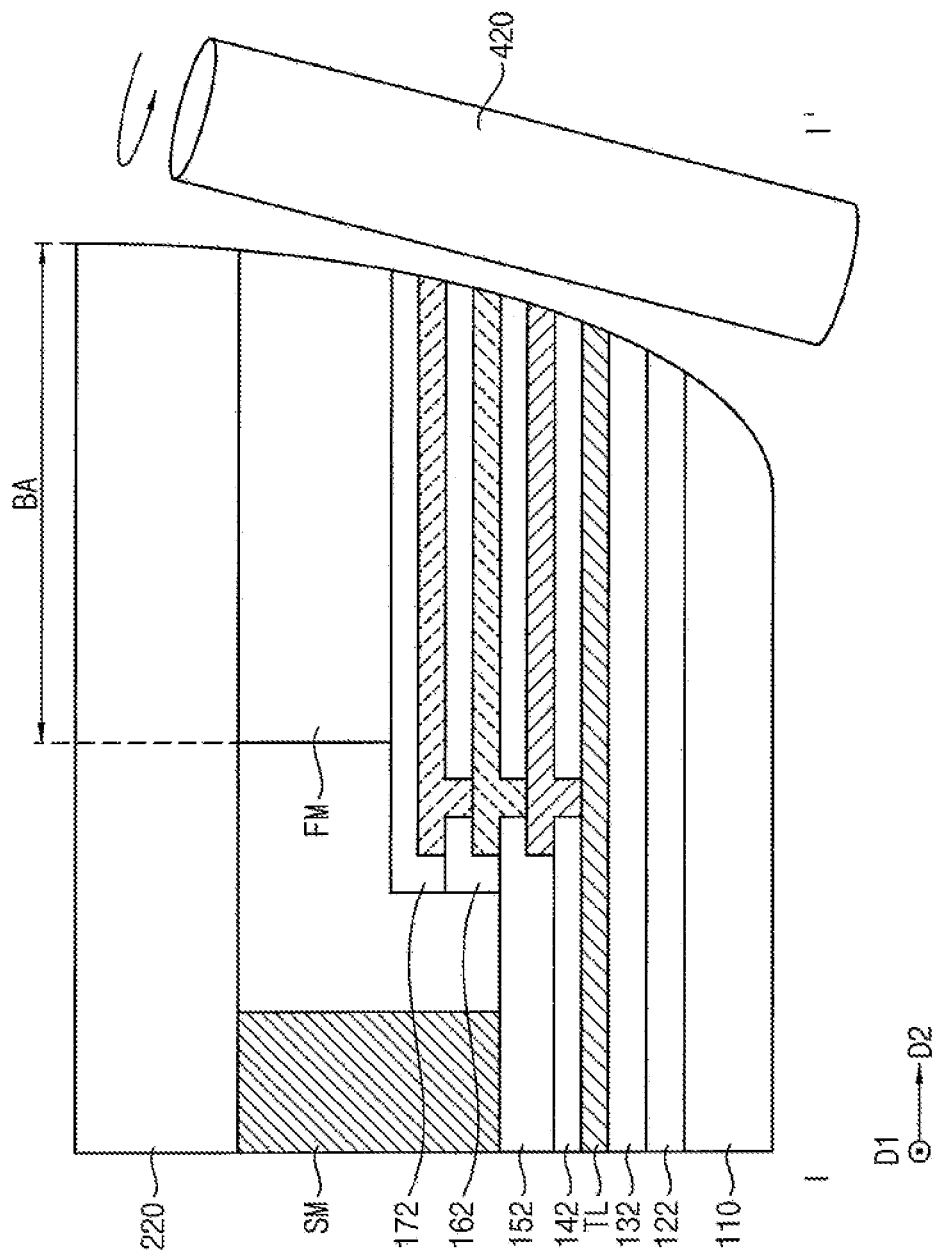
Figure 15:
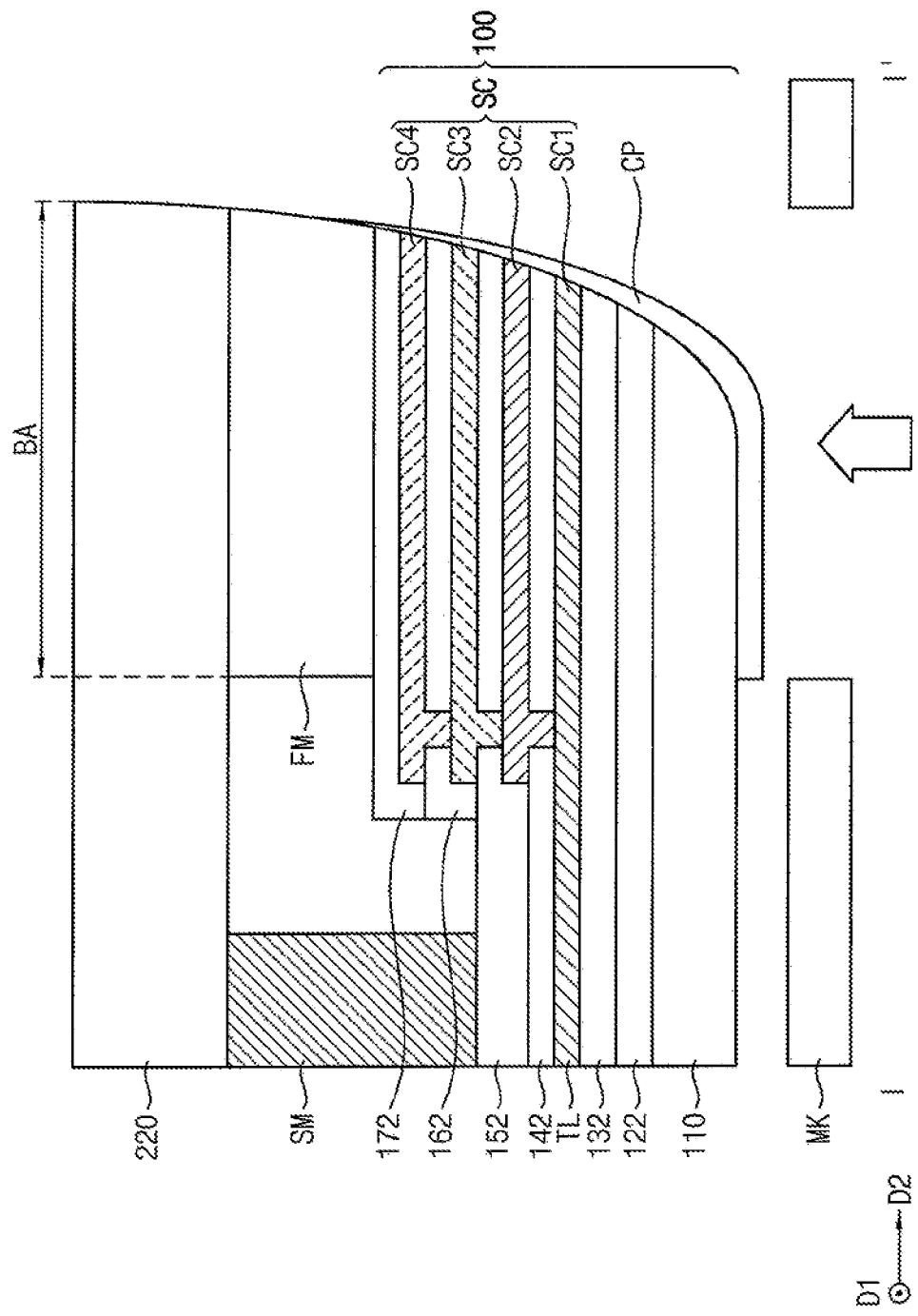

FIGS. 13 to 15 are cross-sectional views illustrating a method of manufacturing a display device according to an exemplary embodiment.

Referring to FIG. 13, an array substrate 100 may be scribed in a vertical direction for a lower surface of the array substrate 100, and a cover substrate 220 may be scribed in a vertical direction for an upper surface of the cover substrate 220.

Thus, the scribed display panel may have a side surface extending in a vertical direction. A grinding process may be further performed to form an inclined side surface of the display panel.

Referring to FIG. 14, an inclined side surface having a round shape may be formed by using a grinder 420.

Referring to FIG. 15, a conductive connection pad CP is formed. As described above, a physical deposition process may be performed using a mask MK as a deposition mask to form the conductive connection pad CP. The conductive connection pad CP may contact a side terminal SC, and may extend along a side surface and a lower surface of the display panel.

Figure 16:
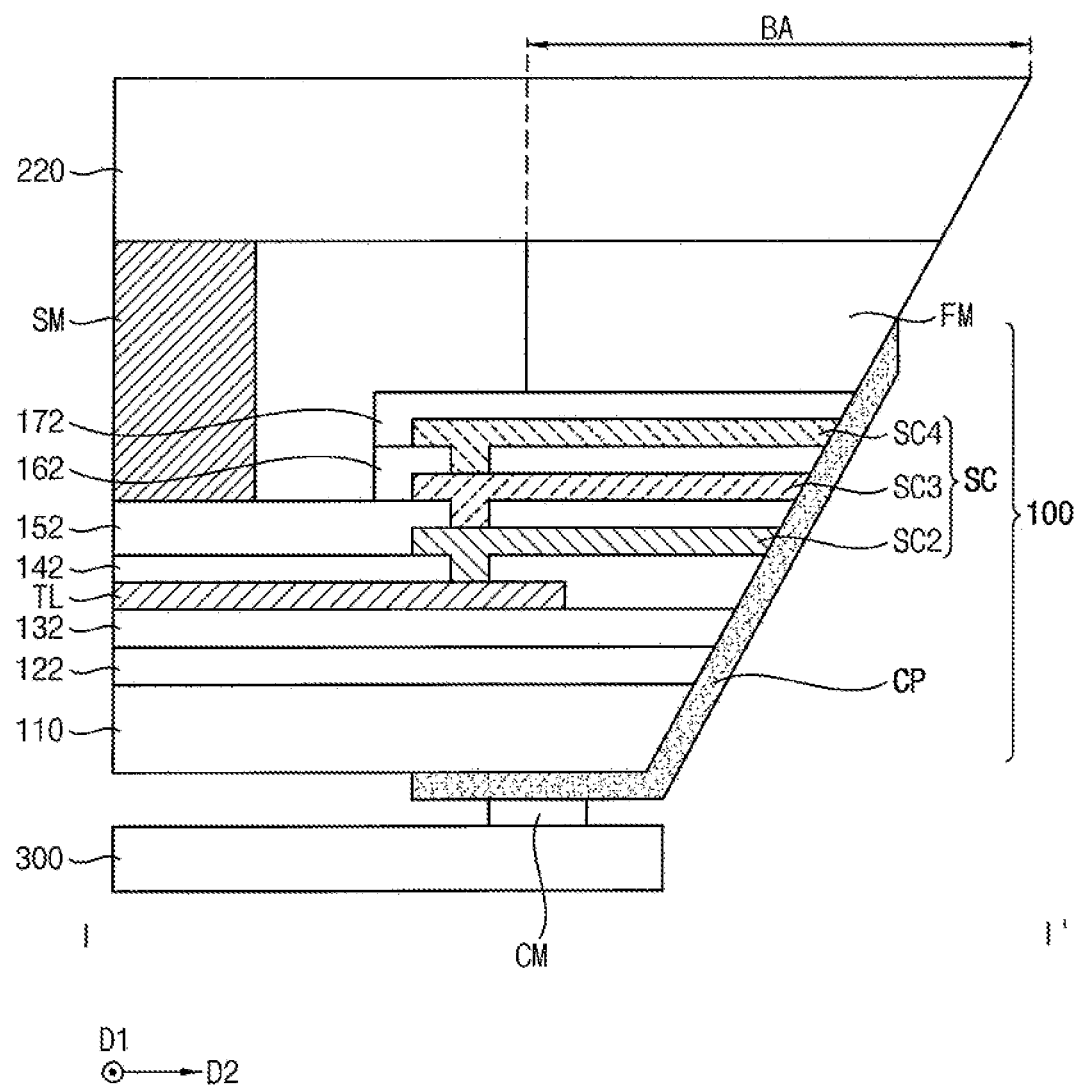
FIGS. 16 and 17 are cross-sectional views illustrating a bonding area of a display device according to exemplary embodiments.
Figure 17:
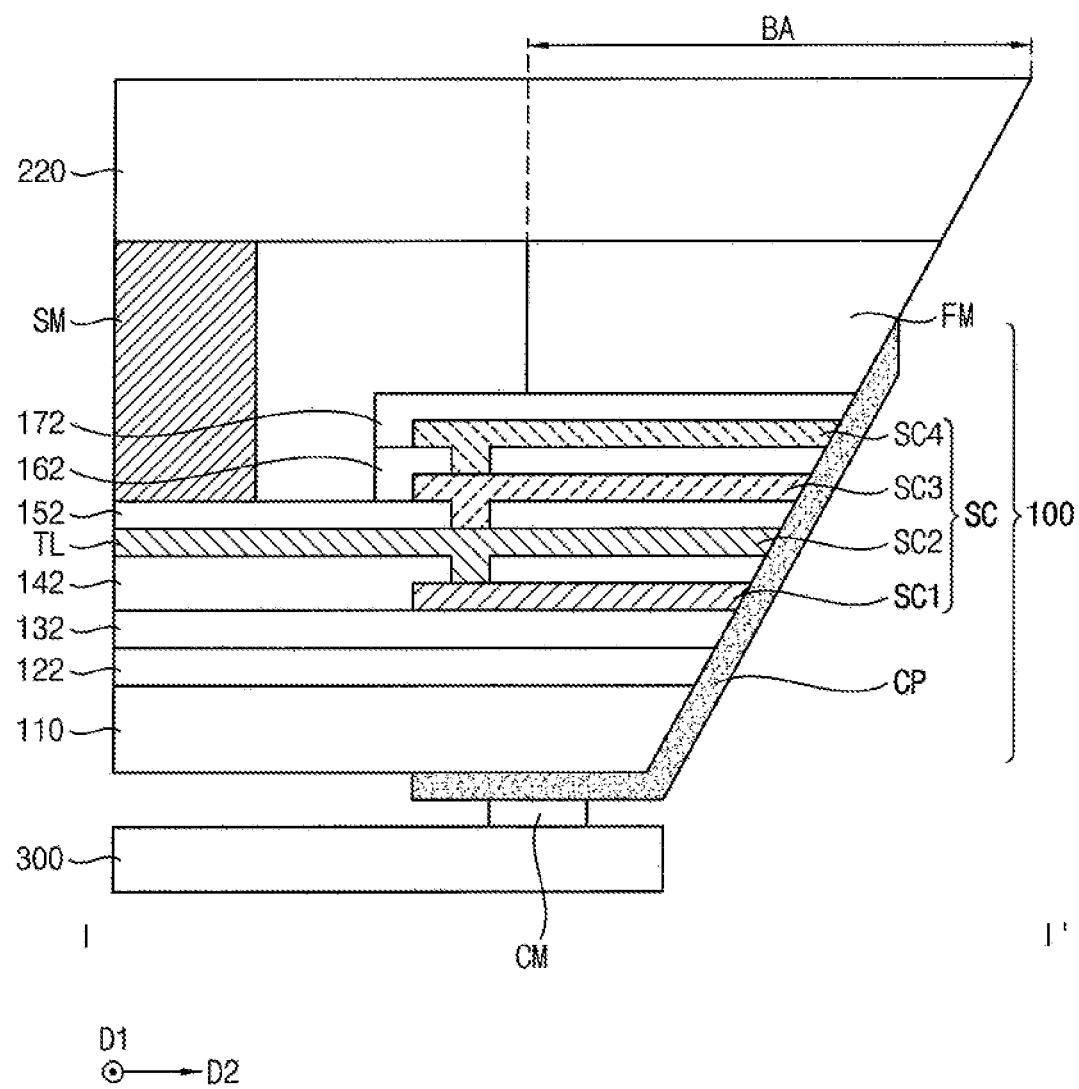

FIGS. 16 and 17 are cross-sectional views illustrating a bonding area of a display device according to exemplary embodiments.

Referring to FIG. 16, a transfer wiring TL may extend short of a side surface of a display panel (or an array substrate 100). Thus, the transfer wiring TL may be spaced apart from a conductive connection pad CP. Thus, a side terminal SC may be formed by conductive layers disposed on the transfer wiring TL.

In an exemplary embodiment, the transfer wiring TL is not exposed through the side surface of the display panel (or the array substrate 100). Thus, damage to the transfer wiring TL, which may be caused in processing the side surface of the display panel, may be prevented.

Referring to FIG. 17, a transfer wiring TL may be formed from the same layer as a gate wiring pattern GP. The transfer wiring TL may be electrically connected to a side terminal SC. The side terminal SC may include a second conductive layer SC2 extending from the transfer wiring TL, a first conductive layer SC1 disposed under the second conductive layer SC2, a third conductive layer SC3 disposed on the second conductive layer SC2 and a fourth conductive layer SC4 disposed on the third conductive layer SC3.

However, exemplary embodiments are not limited thereto. In an exemplary embodiment, the transfer wiring TL may be formed from a metal layer for forming a source electrode, and the transfer wiring TL may serve as the third conductive layer SC3. In an exemplary embodiment, the transfer wiring TL may be formed from a metal layer for forming a connection electrode, and the transfer wiring TL may serve as the fourth conductive layer SC4.

The above exemplary embodiments provides an organic-light emitting display device. However, exemplary embodiments are not limited thereto. For example, exemplary embodiments may be applied for a bonding structure of display devices such as a liquid crystal display device, a electroluminescent display device, a micro LED display device or the like.

Exemplary embodiments may be applied to various display devices. For example, exemplary embodiment may be applied to vehicle-display device, a ship-display device, an aircraft-display device, portable communication devices, display devices for display or for information transfer, a medical-display device, etc.

The foregoing is illustrative of exemplary embodiments and is not to be construed as limiting thereof. Although exemplary embodiments have been described, those skilled in the art will readily appreciate that many modifications are possible in the exemplary embodiments without materially departing from the novel teachings and aspects of the present inventive concept. Accordingly, all such modifications are intended to be included within the scope of the present inventive concept. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the present inventive concept, as set forth in the following claims and equivalents thereof.

What is claimed is:

1. A display device comprising:
    an array substrate including a pixel array disposed on a base substrate, a side terminal disposed on the base substrate, and a transfer wiring electrically connected to the side terminal and the pixel array, the array substrate having an inclined side surface; and
    a conductive connection pad including a first portion directly contacting the inclined side surface of the array substrate and the side terminal, and
    a second portion directly contacting a lower surface of the array substrate,
    wherein the first portion and the second portion are connected to each other, and
    wherein each of the conductive connection pad and the side terminal has an inclined side surface, and the inclined side surface of the conductive connection pad faces and contacts the inclined side surface of the side terminal.

2. The display device of claim 1, further comprising:
    a cover substrate combined with the array substrate,
    wherein an upper end of the conductive connection pad is lower than a lower surface of the cover substrate.

3. The display device of claim 2, further comprising:
    a filling member disposed between an upper surface of the side terminal and the lower surface of the cover substrate and covering the upper surface of the side terminal.

4. The display device of claim 3,
wherein the conductive connection pad contacts a side surface of the filling member.

5. The display device of claim 3,
wherein the filling member protrudes from the side terminal beyond the inclined side surface in a lateral direction, and
wherein the conductive connection pad contacts a lower surface of the filling member.

6. The display device of claim 2,
wherein the cover substrate has an inclined side surface, and
wherein the inclined side surface of the cover substrate and the inclined side surface of the array substrate have the same slope.

7. The display device of claim 2,
wherein the cover substrate has a vertical side surface.

8. The display device of claim 1,
wherein the inclined side surface has a round shape.

9. The display device of claim 1,
wherein the side terminal includes a plurality of conductive layers vertically stacking on each other.

10. The display device of claim 1,
wherein the transfer wiring is spaced apart from the conductive connection pad.

11. The display device of claim 1, further comprising:
a driving device bonded to the conductive connection pad on the lower surface of the array substrate and configured to provide a driving signal or power to the transfer wiring through the conductive connection pad and the side terminal.

* * * * *